United States Patent
Keeth

(10) Patent No.: US 11,658,156 B2
(45) Date of Patent: *May 23, 2023

(54) CHANNEL ROUTING FOR MEMORY DEVICES

(71) Applicant: Micron Technology, Inc., Boise, ID (US)

(72) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

This patent is subject to a terminal disclaimer.

(21) Appl. No.: 17/225,675

(22) Filed: Apr. 8, 2021

(65) Prior Publication Data

US 2021/0257338 A1   Aug. 19, 2021

Related U.S. Application Data

(63) Continuation of application No. 16/298,338, filed on Mar. 11, 2019, now Pat. No. 10,998,291.
(Continued)

(51) Int. Cl.
*H01L 25/065* (2023.01)
*H01L 23/48* (2006.01)
(Continued)

(52) U.S. Cl.
CPC ........... *H01L 25/0657* (2013.01); *G11C 5/10* (2013.01); *G11C 29/12* (2013.01); *H01L 23/481* (2013.01);
(Continued)

(58) Field of Classification Search
CPC ... H01L 25/0657; H01L 23/481; H01L 24/16; H01L 24/24; H01L 25/18; H01L 24/17;
(Continued)

(56) References Cited

U.S. PATENT DOCUMENTS

| 6,538,928 | B1 | 3/2003 | Mobley | |
| 9,941,253 | B1* | 4/2018 | Jung | ........................ H01L 25/50 |

(Continued)

FOREIGN PATENT DOCUMENTS

| CN | 1465095 A | 12/2003 |
| CN | 102129881 A | 7/2011 |
| CN | 103855129 A | 6/2014 |

OTHER PUBLICATIONS

China National Intellectual Property Administration, "First Office Action," issued in connection with Chinese Application No. 201980031005.1, dated Jun. 17, 2021 (4 pages).
(Continued)

*Primary Examiner* — Jonathan Han
(74) *Attorney, Agent, or Firm* — Holland & Hart LLP

(57) ABSTRACT

Systems and devices for routing signals between a memory device and an interface of a host device are described. Some memory technologies may have a defined, preconfigured interface (e.g., bumpout), where each interface terminal may have a specific location and a specific function. Using preconfigured interfaces may allow device maker and memory makers to make parts that are able to connect with one another without special designs. In some cases, a memory device may include a redistribution layer that includes a plurality of interconnects that may be configured couple channel terminals of the memory device with an interface associated with the host device.

20 Claims, 11 Drawing Sheets

Related U.S. Application Data

(60) Provisional application No. 62/667,897, filed on May 7, 2018.

(51) Int. Cl.
  *H01L 23/00* (2006.01)
  *G11C 5/10* (2006.01)
  *G11C 29/12* (2006.01)
  *H01L 25/18* (2023.01)

(52) U.S. Cl.
  CPC .............. *H01L 24/16* (2013.01); *H01L 24/24* (2013.01); *H01L 25/18* (2013.01); *H01L 24/17* (2013.01); *H01L 2224/16146* (2013.01); *H01L 2224/16235* (2013.01); *H01L 2224/17181* (2013.01); *H01L 2224/24225* (2013.01); *H01L 2225/0652* (2013.01); *H01L 2225/06513* (2013.01); *H01L 2225/06517* (2013.01); *H01L 2225/06541* (2013.01); *H01L 2225/06565* (2013.01); *H01L 2924/1436* (2013.01); *H01L 2924/1441* (2013.01)

(58) Field of Classification Search
  CPC . H01L 2224/16146; H01L 2224/16235; H01L 2224/17181; H01L 2224/24225; H01L 2225/06513; H01L 2225/06517; H01L 2225/0652; H01L 2225/06541; H01L 2225/06565; H01L 2924/1436; H01L 2924/1441; H01L 2224/13025; H01L 2224/16227; G11C 5/10; G11C 29/12; G11C 5/066; G11C 5/04; G11C 5/063; G11C 8/12; G11C 5/025; G11C 9/12
  See application file for complete search history.

(56) References Cited

U.S. PATENT DOCUMENTS

| | | |
|---|---|---|
| 2009/0059641 A1 | 3/2009 | Jeddeloh |
| 2013/0082390 A1 | 4/2013 | Crisp et al. |
| 2015/0214178 A1 | 7/2015 | Crisp et al. |
| 2016/0093340 A1 | 3/2016 | Sun et al. |
| 2016/0099197 A1 | 4/2016 | Uematsu et al. |
| 2016/0357630 A1* | 12/2016 | Kang ................. G11C 29/4401 |
| 2017/0194038 A1* | 7/2017 | Jeong ................. H01L 25/0657 |
| 2018/0005995 A1 | 1/2018 | Shibata |
| 2018/0012867 A1* | 1/2018 | Kim ........................ H01L 25/18 |

OTHER PUBLICATIONS

ISA/KR, International Search Report and Written Opinion of the International Searching Authority, Int'l. Appl. No. PCT/US2019/022307, dated Jun. 26, 2019, Korean Intellectual Property Office, Seo-gu, Daejeon, Republic of Korea, 14 pgs.

* cited by examiner

CHANNEL ROUTING FOR MEMORY DEVICES

CROSS REFERENCE

The present application for patent is a continuation of U.S. patent application Ser. No. 16/298,338 by Keeth, entitled "CHANNEL ROUTING FOR MEMORY DEVICES" filed Mar. 11, 2019, which claims priority to U.S. Provisional Patent Application No. 62/667,897 by Keeth, entitled "CHANNEL ROUTING FOR MEMORY DEVICES" filed May 7, 2018, assigned to the assignee hereof and each of which is expressly incorporated by reference in its entirety.

BACKGROUND

The following relates generally to systems and devices channel routing with a memory device.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics. Advancing memory technology has realized improvements for many of these metrics, but high reliability, low latency, and/or low-power devices tend to be expensive and unscalable. As the quantity of applications for high reliability, low latency, low-power memory increases, so too does the need for scalable, efficient, and cost-effective devices.

DETAILED DESCRIPTION

Some memory devices include relatively long conductive paths between various components and require increased power to perform operations (e.g., access operations) over the long conductive paths. Some memory technologies may include a plurality of channel terminals disbursed throughout a die area. Disbursing channel terminals throughout the die area may shorten the conductive path between the host device and a memory cell and may reduce the amount of power to access the memory cell. Such configurations of memory technologies may not be completely or easily compatible with other (e.g., preexisting) interfaces such as bumpouts for certain memory technologies. Systems and devices are described for routing channels between memory devices and interfaces for memory technologies (e.g., a bumpout for HBM or HBM2).

Systems and devices for routing signals between a memory device and an interface of a host device are described herein. Some memory technologies have a defined, preconfigured interface (e.g., bumpout), where each interface terminal may have a specific location and a specific function. Using preconfigured interfaces may facilitate making parts that are able to connect with one another without special designs. In some cases, a memory device may include a redistribution layer that includes a plurality of interconnects. The plurality of interconnects may be configured couple channel terminals of the memory device with an interface associated with the host device.

Features of the disclosure introduced above are further described below in the context of an exemplary system illustrated in FIG. 1. Specific examples and other features are further illustrated by and described with reference to apparatus diagrams and system diagrams (FIGS. 2-11) that relate to channel routing with a memory device.

Figure 1:
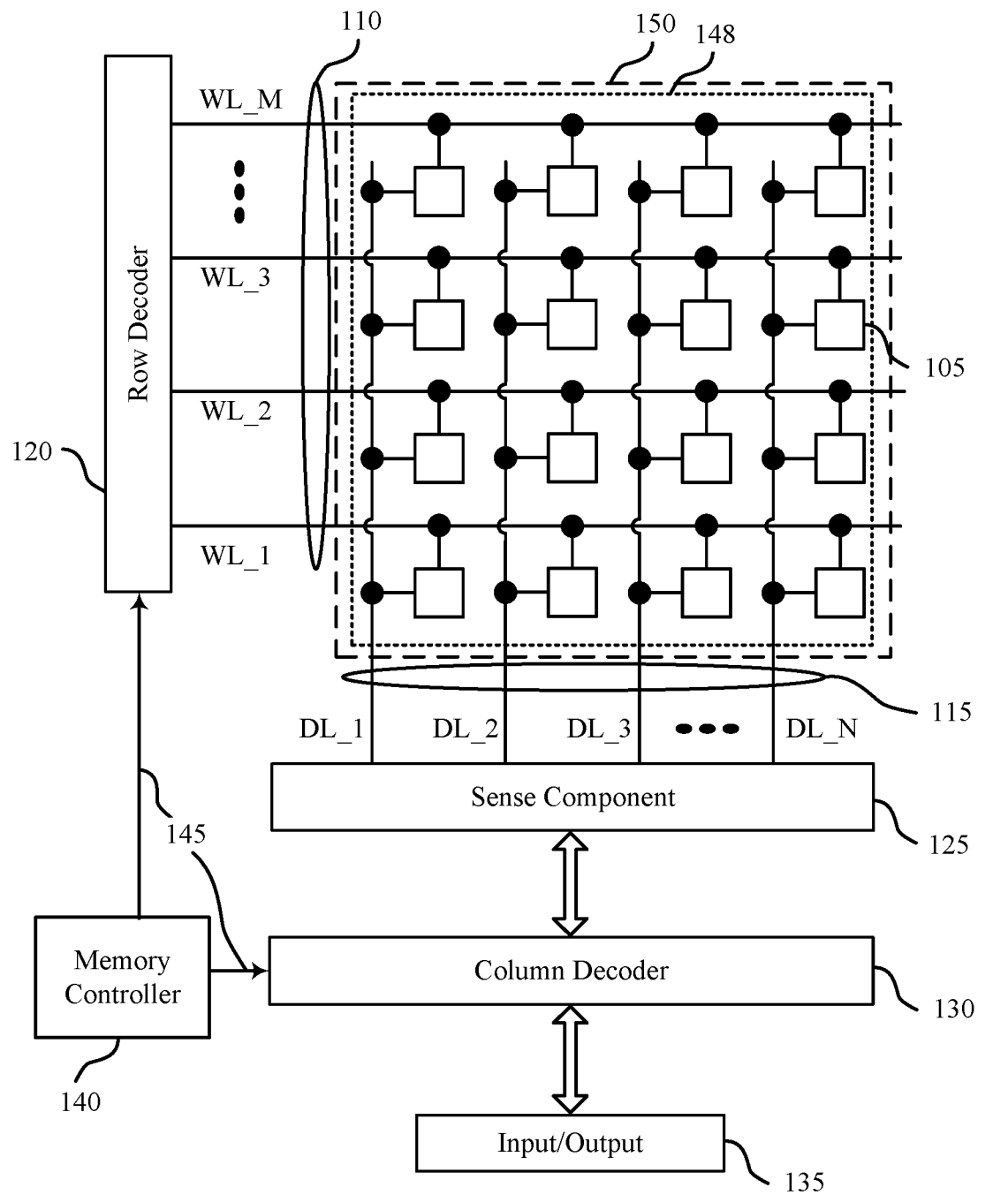
FIG. 1 illustrates an example of a memory die that supports channel routing for a memory device in accordance with examples of the present disclosure.

FIG. 1 illustrates an example memory die 100 in accordance with various aspects of the present disclosure. Memory die 100 may also be referred to as an electronic memory apparatus, a memory array, an array of memory cells, or a deck of memory cells, in some examples. The memory die 100 may include a memory array 148 that includes memory cells 105 that are programmable to store different states. Memory cells 105 may be arranged in one or more banks of memory cells that may be independently accessible. Each memory cell 105 may be programmable to store two states, denoted as a logic 0 and a logic 1. In some cases, memory cell 105 is configured to store more than two logic states.

A memory cell 105 may store a charge representative of the programmable states in a capacitor; for example, a charged and uncharged capacitor may represent two logic states, respectively. DRAM architectures may use such a design, and the capacitor employed may include a dielectric material with linear or para-electric electric polarization properties as the insulator. FeRAM architectures may also employ such a design.

Operations such as reading and writing may be performed on memory cells 105 by activating access line 110 and digit line 115. Access lines 110 may also be known as word lines 110, and bit lines 115 may also be known digit lines 115. References to word lines and bit lines, or their analogues, are interchangeable without loss of understanding or operation. Activating a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. Additionally or alternatively, for example, each row of memory cells 105 may be arranged in one or more banks of memory cells.

In some architectures, the logic storing device of a cell, e.g., a capacitor, may be electrically isolated from the digit line by a selection component (not shown). The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Row decoder 120 and column decoder 130 may receive a row address and a column address, respectively, for a memory cell located within one specific bank of memory cells. Additionally or alternatively, each bank of memory cells may be in electronic communication with a separate row decoder 120 and column decoder 130. For example, memory die 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing a memory cell 105, the cell may be read, or sensed, by sense component 125 to determine the stored state of the memory cell 105. For example, after accessing the memory cell 105, the capacitor of memory cell 105 may discharge onto its corresponding digit line 115. Discharging the capacitor may result from biasing, or applying a voltage, to the capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set or written by similarly activating the relevant word line 110 and digit line 115— e.g., a logic value may be stored in the memory cell 105. Column decoder 130 or row decoder 120 may accept data, for example input/output 135, to be written to the memory cells 105. A memory cell 105 may be written by applying a voltage across the capacitor. This process is discussed in more detail below.

In some cases, routing signals with a host device through the input/output 135 may use additional interconnects. Such cases may occur when a bumpout matrix of the memory die 100 does not match a bumpout matrix of the host device. Systems and devices are disclosed herein for coupling a finer-grain DRAM memory stack with an HBM bumpout or an HBM2 bumpout. Systems and devices are also disclosed for coupling a finer-grain DRAM memory stack with an HBM bumpout (e.g., HBM3) that includes a bumpout that is distributed throughout a die area (e.g., FIG. 11).

The memory controller 140 may control the operation (e.g., read, write, re-write, refresh, discharge, etc.) of memory cells 105 through the various components, for example, row decoder 120, column decoder 130, and sense component 125. Memory controller 140 may be a component of memory die 100 or may be external to memory die 100 in various examples. In some cases, one or more of the row decoder 120, column decoder 130, and sense component 125 may be co-located with the memory controller 140. Memory controller 140 may generate row and column address signals in order to activate the desired word line 110 and digit line 115. The memory controller 140 may activate the desired word line 110 and digit line 115 of a specific bank of memory cells via at least one channel traversing the memory array 148. Memory controller 140 may also generate and control various voltages or currents used during the operation of memory die 100. For example, it may apply discharge voltages to a word line 110 or digit line 115 after accessing one or more memory cells 105. Memory controller 140 may be coupled to memory cells 105 via channels 145. Channels 145 are illustrated in FIG. 1 as logical connections with row decoder 120 and column decoder 130, but those skilled in the art will recognize that other configurations may be employed. As described herein, memory controller 140 may exchange data (e.g., from a read or write operation) with cells 105 multiple times per clock cycle.

The memory controller 140 may also be configured to communicate commands, data, and other information with a host device (not shown). The memory controller 140 may use a modulation scheme to modulate signals communicated between the memory array and the host device. In some cases, the modulation scheme that is used may be selected based on the type of the communication medium (e.g., organic substrate or high-density interposer) used to couple the host device with the memory device. An I/O interface may be configured based on what type of modulation scheme is selected.

Memory die 100 may include memory array 148, which may overlie a complementary metal-oxide-semiconductor (CMOS) area, such as CMOS under array (CuA) 150. Memory array 148 may include memory cells 105 that are connected to word lines 110 and digit lines 115. The CuA 150 may underlie the memory array 148 and include support circuitry. CuA 150 may underlie the row decoder 120, sense component 125, column decoder 130, and/or memory controller 140. Or CuA 150 may include one or more of row decoder 120, sense component 125, column decoder 130, and memory controller 140. The support circuitry may support one or more additional arrays of memory cells present in a stacked configuration. In a stacked configuration, CuA 150 may facilitate accessing one or more memory cells in each array. For example, CuA 150 may facilitate the transfer of data between a memory cell coupled to a channel of memory array 148, a memory cell coupled to a channel of an additional array that is coupled to memory array 148, and the controller.

In general, the amplitude, shape, or duration of an applied voltage or current discussed herein may be adjusted or varied and may be different for the various operations discussed in operating the memory die 100. Furthermore, one, multiple, or all memory cells 105 within memory die 100 may be accessed simultaneously; for example, multiple or all cells of memory die 100 may be accessed simultaneously during a reset operation in which all memory cells 105, or a group of memory cells 105, are set to a single logic state.

Figure 2:
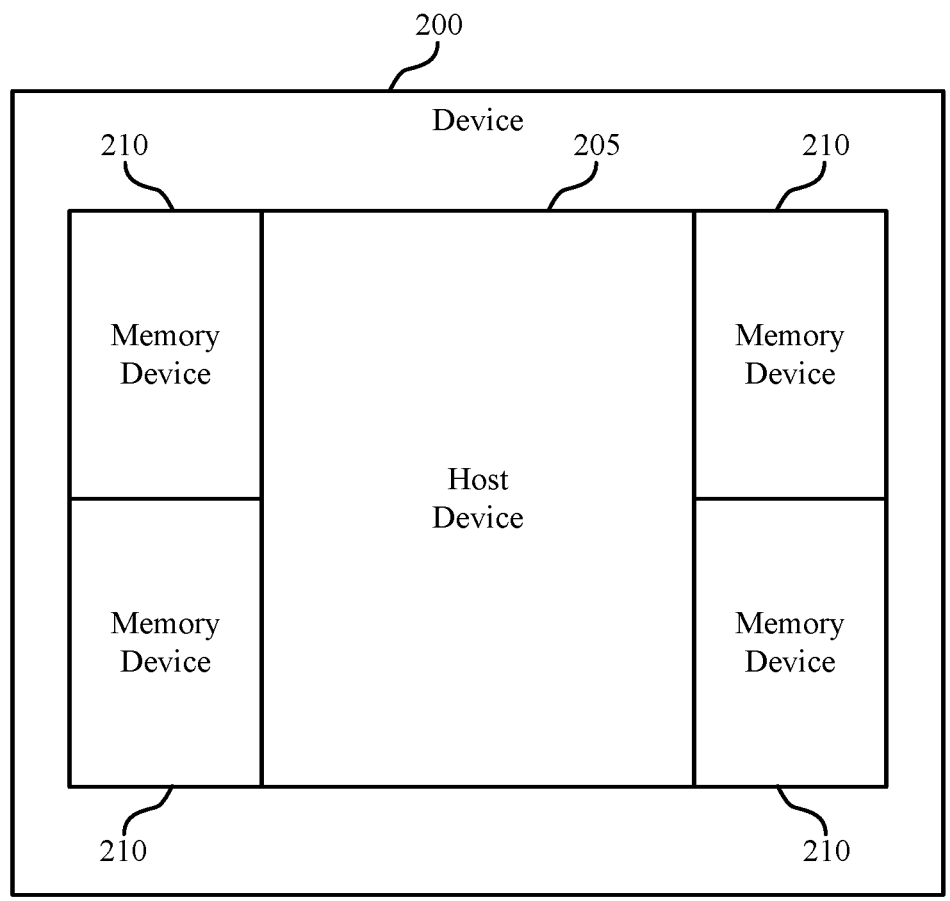
FIG. 2 illustrates an example of a device that supports channel routing for a memory device in accordance with examples of the present disclosure.

FIG. 2 illustrates an apparatus or system 200 that supports channel routing for a memory device in accordance with various examples of the present disclosure. The system 200 may include a host device 205 and a plurality of memory devices 210. The plurality of memory device 210 may be examples of a finer grain memory device (e.g., finer grain DRAM or finer grain FeRAM).

The host device 205 may be an example of a processor (e.g., a central processing unit (CPU), a graphics processing unit (GPU)), or a system on a chip (SoC). In some cases, the host device 205 may be a separate component from the memory device such that the host device 205 may be manufactured separately from the memory device. The host device 205 may be external to the memory device 210 (e.g., a laptop, server, personal computing device, smartphone, personal computer). In the system 200, the memory devices 210 may be configured to store data for the host device 205.

The host device 205 may exchange information with the memory devices 210 using signals communicated over signal paths. A signal path may be any path that a message or transmission may take from a transmitting component to a receiving component. In some cases, a signal path may be a conductor coupled with at least two components, where the conductor may selectively allow electrons to flow between the at least two components. The signal path may be formed in a wireless medium as in the case for wireless communications (e.g., radio frequency (RF) or optical). In some cases, the signal paths may at least partially include a high-density interposer, such as a silicon interposer. The signal paths may at least partially include a first substrate, such as an organic substrate of the memory device, and a second substrate, such as a package substrate (e.g., a second organic substrate) that may be coupled with at least one, if not both, of the memory device 210 and the host device 205.

In some applications, the system 200 may benefit from a high-speed connection between the host device 205 and the memory devices 210. As such, some memory devices 210 support applications, processes, host devices, or processors that have multiple terabytes per second (TB/s) bandwidth needs. Satisfying such a bandwidth constraint within an acceptable energy budget may pose challenges in certain contexts.

The memory devices 210 may be configured such that the signal path between the memory cells in the memory devices 210 and the host device 205 are as short as the material properties, operating environment, component layout, and application allow. For example, the memory devices 210 may be bufferless memory devices with a point-to-point connection between the host device and the memory array. In another example, the data channels coupling a memory device 210 with the host device 205 may comprise a point-to-many-point configuration, with one pin of the host device 205 coupled with corresponding pins of at least two memory arrays. In another example, the data channels coupling a memory device 210 with the host device 205 may be configured to be shorter than other designs, such as other near memory applications (e.g., a graphics card employing GDDR5-compliant DRAM).

In some cases, a high-density interposer (e.g., a silicon interposer or a glass interposer) may be used to couple the memory devices 210 with the host device 205. Depending on the constraints of the host device 205 (e.g., bandwidth constraints), various different types of communication mediums may be used (e.g., silicon interposers or organic interposers). The memory dies of the memory devices 210 may be configured to work with multiple types of communication mediums (e.g., interposers and/or multiple types of substrates such as organic substrates). As such, the memory dies of the memory devices 210 may be reconfigurable based on a type of communication medium (e.g., substrate or high-density interposer) used to couple the host device 205 with the memory devices 210.

The host device 205 may, in some cases, be configured with a particular interface or ballout comprising a design (e.g., a matrix or pattern) of terminals, and the memory devices 210 may be configured with a different matrix of terminals. Such a mismatch may make it difficult for the memory devices 210 and the host device 205 to communicate. A redistribution layer may include a plurality of interconnects that are configured to couple the design of terminals of the host device 205 with the design of terminals of the memory devices 210. Such a configuration may enable devices with non-matching bumpouts to communicate with one another.

Figure 3:
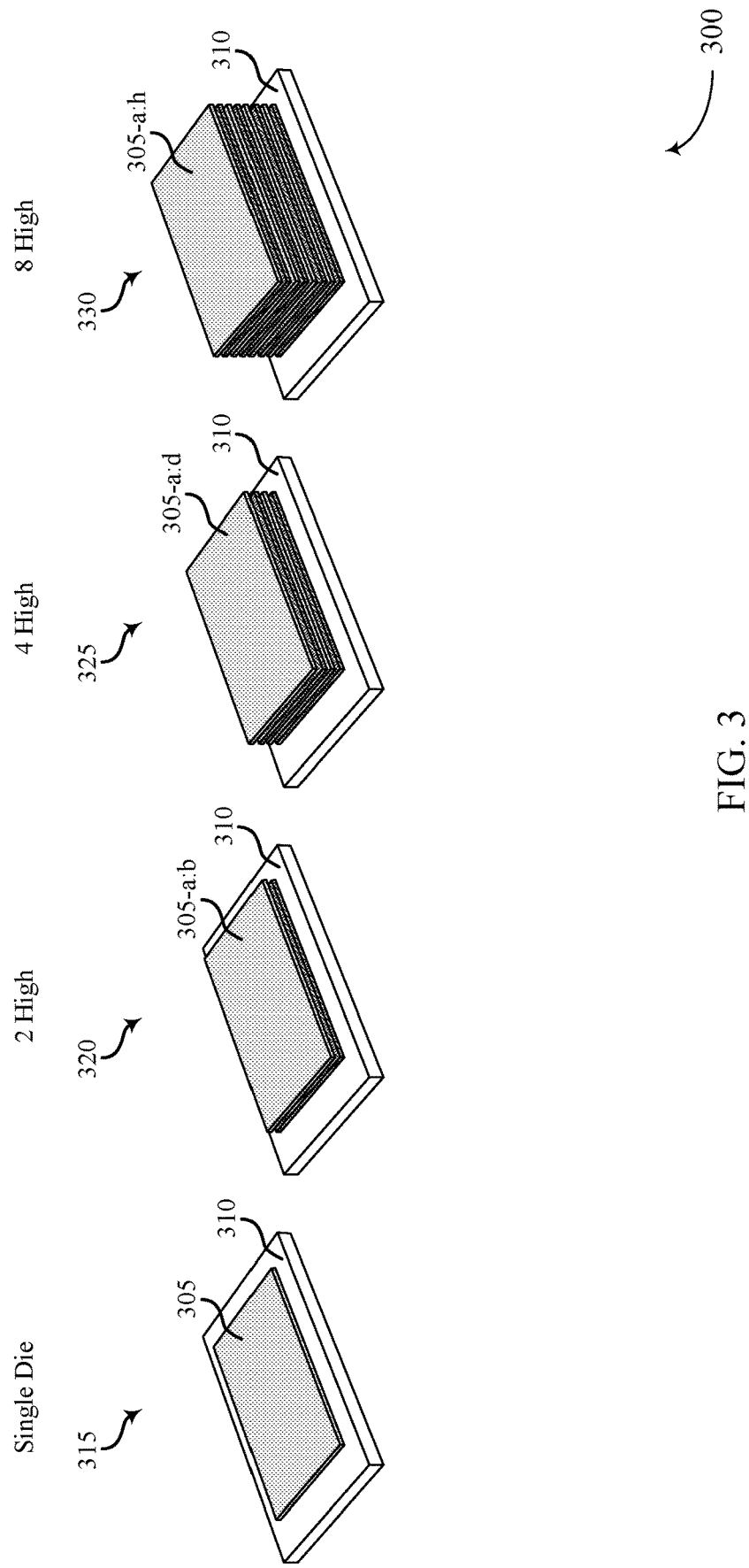
FIG. 3 illustrates an example of a device that supports channel routing for a memory device in accordance with examples of the present disclosure.

FIG. 3 illustrates an example of a device or devices 300 in accordance with various examples of the present disclosure. The memory devices 300 include at least one memory die 305 and a communication medium 310. The communication medium 310 may, in some cases, be an example of a substrate.

The memory die 305 may include a plurality of memory cells (as shown in and described with reference to FIG. 1) that may be programmable to store different logic states. For example, each memory cell may be programmed to store one or more logic states (e.g., a logic '0', a logic '1', a logic '00', a logic '01', a logic '10', a logic '11'). The memory cells of the memory dies 305 may use any quantity of storage technologies to store data including DRAM, FeRAM, phase change memory (PCM), 3D XPoint memory, NAND memory, NOR memory, or a combination thereof. In some cases, a single memory device may include a first memory die that uses a first memory technology (e.g., DRAM) and a second memory die that uses second memory technology (e.g., FeRAM) different from the first memory technology.

The memory dies 305 may be an example of two-dimensional (2D) array of memory cells. In some cases, multiple memory dies 305 may be stacked on top of one another to form a three-dimensional (3D) array. A memory die may include multiple decks of memory cells stacked on top of one another. Such a configuration may increase the quantity of memory cells that may be formed on a single die or substrate as compared with 2D arrays. In turn, this may reduce production costs, or increase the performance of the memory array, or both. Each level of the array may be positioned so that memory cells across each level may be approximately aligned with one another, forming a memory cell stack. In some cases, the memory dies 305 may be stacked directly on one another. In other cases, one or more of the memory dies 305 may be positioned away from a stack of memory dies (e.g., in different memory stacks).

For example, a first memory device 315 may be an example of a single die package that includes a single memory die 305 and a communication medium 310. A second memory device 320 may be an example of a two-high device that includes two memory dies 305-$a$:$b$ and a communication medium 310. A third memory device 325 may be an example of a four-high device that includes four memory dies 305-$a$ through 305-$d$ and a communication medium 310. A fourth memory device 330 may be an example of an eight-high device that includes eight memory dies 305-$a$ through 305-$h$ and a communication medium 310. A memory device 300 may include any quantity of memory dies 305, that may in some examples be stacked on top of a common interposer (e.g., a common substrate). The dies are shown as different shadings to more clearly demonstrate the different layers. In some cases, the memory dies in different layers may be configured similarly as adjacent dies in the memory device.

The memory dies 305 may include one or more vias (e.g., through-silicon vias (TSVs)). In some cases, the one or more vias may be part of internal signal paths that couple controllers with memory cells. The vias may be used to communicate between memory dies 305, for example, when the memory dies 100 are stacked on one another. Some vias may be used to facilitate communication between a controller of the memory device and at least some of the memory dies 305. In some cases, a single via may be coupled with multiple memory dies 305.

The communication medium 310 may be any structure or medium used to couple the memory dies 305 with a host device (not shown in FIG. 3) such that signals may be exchanged between the memory dies 305 and the host device. The communication medium 310 may be an example of a substrate, an organic substrate, a high-density interposer, a silicon interposer, a glass interposer, silicon photonics, optical communications, or other wireline communications. In some cases, the communication medium 310 may be any structure that could benefit from a multi-configurable I/O. The communication medium 310 may be positioned above, below, or to the side of a memory array. The communication medium 310 may not be limited to being underneath other components but may be in any configuration relative to the memory array and/or other components. In some instances, the communication medium 310 may be referred to as a substrate, however, such references are not to be considered limiting.

The communication medium 310 may be formed of different types of materials. In some cases, the communication medium 310 be one or more organic substrates. For example, the communication medium 310 may include a package substrate (e.g., an organic substrate) coupled with at least one if not both of the host device and the stack of memory dies 305. In another example, the communication medium 310 may include an organic substrate of the memory device and the package substrate. A substrate may be an example of a printed circuit board that mechanically supports and/or electrically connects components. The substrate may use conductive tracks, pads and other features etched from one or more layers of a conductive material (e.g., copper) laminated onto and/or between layers of a non-conductive material. Components may be fastened (e.g., soldered) onto the substrate to both electrically connect and mechanically fasten the components. In some cases, non-conductive materials of a substrate may be formed of a variety of different materials including phenolic paper or phenolic cotton paper impregnated with resin, fiberglass impregnated with resin, metal core board, polyimide foil, Kapton, UPILEX, polyimide-fluoropolymer composite foil, Ajinomoto build-up film (ABF), or other materials, or a combination thereof.

In some cases, the communication medium 310 may be a high-density interposer such as a silicon interposer or a glass interposer. Such a high-density interposer may be configured to provide wide communication lanes between connected components (e.g., a memory device and a host device). The high-density interposer may include a plurality channels that may exhibit a high-resistance (e.g., relatively lossy) for communicating between devices. The channels may be highly resistive due to the dimensions of the conductor used to form the channel. The channels may, in some cases, be independent of one another in some cases. Some channels may be unidirectional and some channels may be bidirectional.

The high-density interposer may provide wide communication lanes by offering a high quantity of channels to connect components. In some cases, the channels may be thin traces of connecter (e.g., copper), thereby making each individual channel lossy. Because each channel may be highly resistive, as the frequency of data transferred increases, the power needed to transfer the data goes up in a non-linear relationship with the frequency. Such characteristics may impose a practical frequency threshold (e.g., ceiling) that can be used to transmit data given an amount of transmit power over a channel of the silicon interposer.

To increase the amount of data transferred in a given amount of time, the high-density interposer may include a very high quantity of channels. As such, a bus of the memory device that uses a high-density interposer may be wider than buses of other types of memory devices (e.g., memory devices that use organic substrates) used in some DRAM architectures, such as DDR4 (double data rate fourth-generation synchronous dynamic random-access memory) or GDDR5 (double data rate type five synchronous graphics random-access memory). The substrate (e.g., silicon, glass, organic) may be formed of a first material (e.g., silicon, glass, organic) that is different from a second material that forms a substrate of the package. In some cases, the first material may be the same as the second material.

The memory dies 305 may be coupled with a built-in self-test (BIST) substrate. The BIST substrate may be coupled with the communication medium 310. The memory stack may be bufferless, meaning that the base layer may not include redrivers, among other components. The BIST substrate may be configured with components that allow the memory stack to be tested, but not components that perform the functions of a buffer. In such cases, the memory stack may be bufferless and have a BIST substrate.

Figure 4:
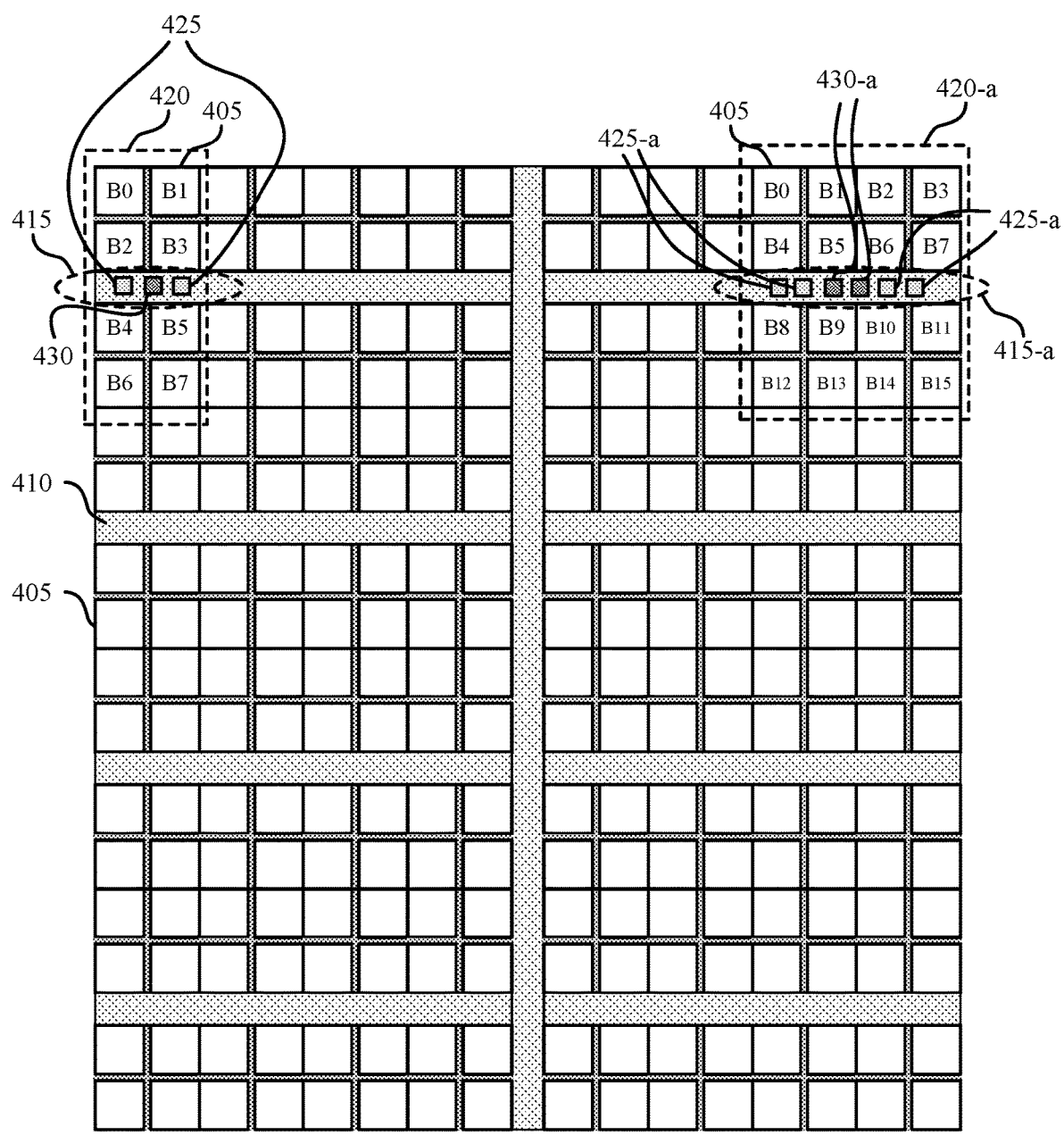
FIG. 4 illustrates an example of a memory die that supports channel routing for a memory device in accordance with examples of the present disclosure.

FIG. 4 illustrates an example of a memory die 400 in accordance with various examples of the present disclosure. The memory die 400 may be an example of a memory die 305 described with reference to FIG. 3. In some cases, the memory die 400 may be referred to as a memory array, an array of memory cells, or a deck of memory cells. The various components of the memory die 400 may be configured to facilitate high bandwidth data transfer between the host device and a memory device with which the memory die 400 is associated.

The memory die 400 may include a plurality of banks 405 of memory cells (as represented by the white boxes), a plurality of input/output (I/O) areas 410 (sometimes referred to as I/O stripes or I/O regions) traversing the memory cells of the memory die 400, and a plurality of data channels 415 that couple the memory die 400 with the host device. Each of the banks 405 of memory cells may include a plurality of memory cells configured to store data. The memory cells may be DRAM memory cells, FeRAM memory cells, or other types of memory cells. At least some, if not each, of the plurality of I/O areas 410 may include a plurality of power pins and ground pins configured to couple the memory cells of the memory die 400 with power and ground.

The memory die 400 may be divided into cell regions 420 associated with different data channels 415. For example, a single data channel 415 may be configured to couple a single cell region 420 with the host device. The pins of the I/O channel may be configured to couple multiple cell regions 420 of the memory die 400 to power, ground, virtual ground, and/or other supporting components.

To provide a high throughput of data (e.g., multiple TB/s) between a host device (not shown) and the memory die 400, a path length between any given memory cell and the host interface may be shortened, as compared to previous solutions. In addition, shortening the data path between any given memory cell and the host device may also reduce the power consumed during an access operation (e.g., read operation or write operation) of that given memory cell. Different architectures and/or strategies may be employed to reduce the size of the data path.

In some examples, the memory die 400 may be partitioned into a plurality of cell regions 420. Each cell region 420 may be associated with a data channel 415. Two different types of cell region 420 are illustrated, as one example, but the entire memory die 400 may be populated with any quantity of cell regions 420 having any shape. A cell region 420 may include a plurality of banks 405 of memory cells. There may be any quantity of banks 405 in a cell region 420. For example, the memory die 400 illustrates a first cell region 420 that may include eight banks 405 and a second cell region 420-a that may include sixteen banks 405-a.

Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 420 may be selected based on the bandwidth constraints of the host device, the power needs of the host device or the memory device, the size of the data channel, the type of interposer used to couple the memory die 400 with the host device, a data rate associated with the data channel, other considerations, or any combination thereof. In some cases, the memory die 400 may be partitioned such that each cell region 420 may be the same size. In other cases, the memory die 400 may be partitioned such that the memory die 400 may have cell regions 420 of different sizes.

A data channel 415 (associated with a cell region) may include a quantity of pins for coupling the memory cells of the cell region 420 with the host device. At least a portion of the data channel 415 may comprise channels of the substrate (e.g., high-density interposer or organic substrate). The data channel 415 may include a data width specifying how many data pins 425 (sometimes referenced as DQ pins) are in the data channel 415. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one command/address (C/A) pin 430. Each memory cell in the cell region 420 may be configured to transfer data to and from the host device using the pins 425, 430 associated with the cell region 420. The data channel 415 may also include a clock pin (e.g., CLK) and/or a read clock pin or a return clock pin (RCLK).

In some cases, the channel width of the data channel may vary based on the type of communication medium (e.g., high-density interposer or organic substrate) used to couple the memory device and the host device. For example, if a first substrate (e.g., a high-density interposer) is used to couple the memory device and the host device, then the channel width may be X8. In another example, however, if a different substrate (e.g., an organic substrate) is used to couple the memory device and the host device, then the channel width may be X4. An I/O interface (not shown in FIG. 4) of the memory die 400 may be configured to support both channel widths. In some instances, to maintain data bandwidth, data throughput, or data accessibility, different modulation schemes may be used to communicate data across channels with different widths. For example, PAM4 may be used to modulate signals communicated across an X4 channel and NRZ may be used to modulate signals communicated across an X8 channel.

In some cases, the channels may be coupled with the host device using interconnects that are part of fan-out packaging. In this manner, the memory die 400 may realize the advantages of short pin lengths and channels distributed throughout memory die 400 and still couple with the host device.

The I/O area 410 (e.g., the I/O stripe) may, in some cases, bisect the banks 405 of memory cells in the cell region 420. In this manner, the data path for any individual memory cell may be shortened.

Figure 5:
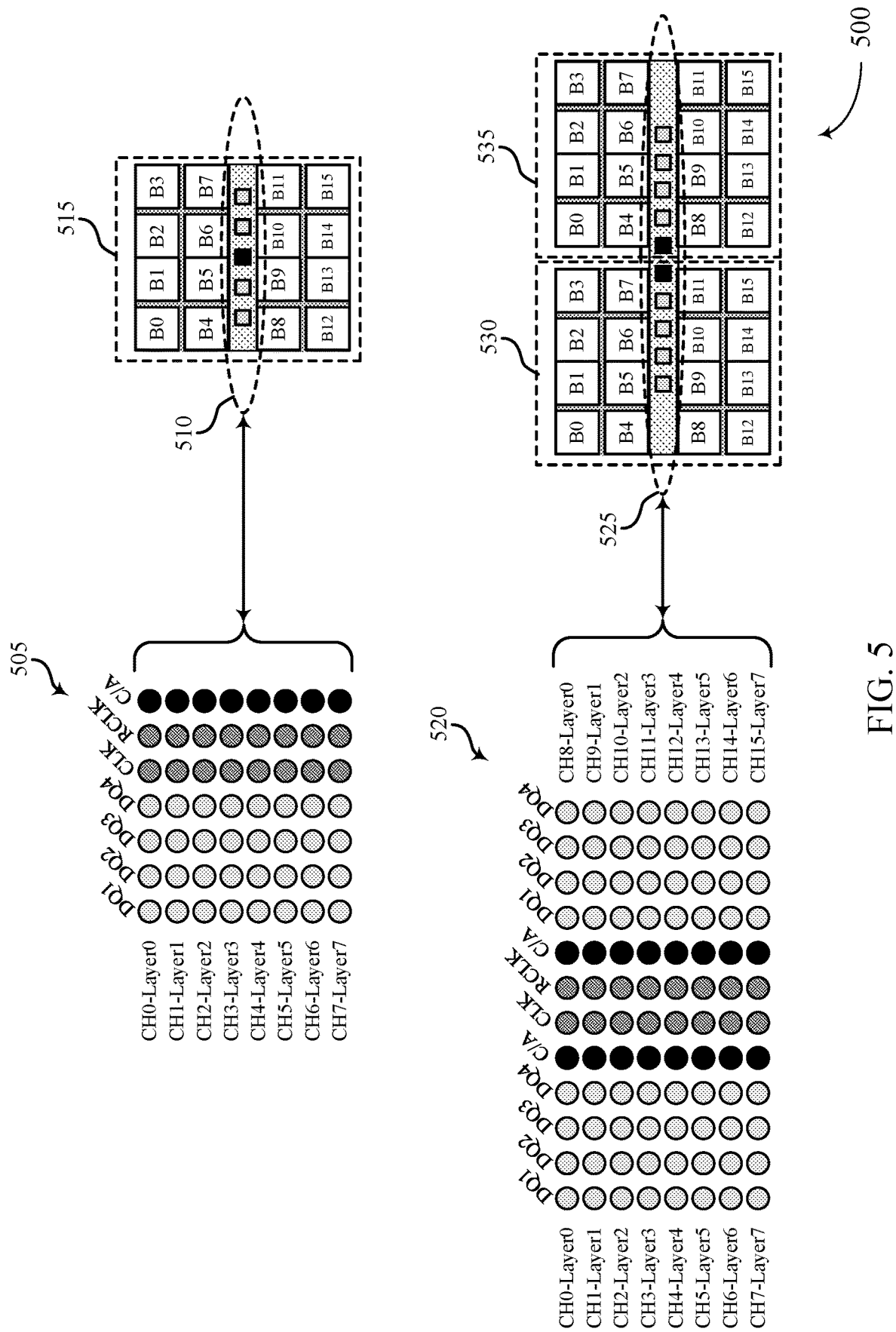
FIG. 5 illustrates an examples of data channels that support channel routing for a memory device in accordance with examples of the present disclosure.

FIG. 5 illustrates an example of a data channel configurations 500 that support channel routing for a memory device in accordance with various examples of the present disclosure. For example, a first data channel configuration 505 illustrates an independent data channel 510 that services a first cell region 515. A second data channel configuration 520 illustrates a data channel pair 525 where data channels for two cell regions (e.g., second cell region 530 and third cell region 535) share clock pins. In some cases, the channel width of the data channel configurations may be adjustable based at least in part on a type of communication medium (e.g., organic substrate or high-density interposer) used to couple the host device with the memory device. For example, if an organic substrate is used, the data channel may have a first channel width, and, if a high-density interposer is used, the data channel may have a second channel width that is larger than the first channel width (e.g., twice as big).

The data channel 510 illustrates a data channel for a stacked memory device that includes eight layers that has a channel width of four (e.g., there are four data pins). Each row of pins in the data channel 510 may be associated with a cell region in a separate layer. The first cell region 515 illustrates a cell region of a single layer. As such, the first cell region 515 may be associated with a single row of the pins of the data channel 510. The quantity of pins in a data channel may be based on the quantity of layers in the memory device because a single data channel may be configured to couple with multiple layers.

In some cases, the term data channel may refer to pins associated with a single cell region of a single layer. The term data channel may refer to pins associated with multiple cell regions across multiple layers. In some examples, data channels may be coupled with a single cell region (e.g., without being coupled with another cell region) of any given layer or memory die. The same may also be true for the data channel pair 525 of the second data channel configuration 520. The data channel pair 525 shows pins for cell regions across multiple layers of the memory device. Although data channel 510 and data channel pair 525 shown may be associated with cell regions in eight layers, any quantity of layers are possible. For example, the data channel 510 and data channel pair 525 may be associated with cell regions in one, two, three, four, five, six, seven, eight, nine, ten, eleven, twelve, thirteen, fourteen, fifteen, or sixteen (or more) layers of the memory device.

The data channel 510 includes four data pins (DQ0-DQ4), a clock pin (CLK), a read clock pin or return clock pin (RCLK), and a command/address pin (CA). In other cases, the data channel may have a different rank or different channel width. In such situations, the quantity of data pins may be different. For example, the data channel 510 may have a channel width of eight and may include eight data pins. Any quantity of data pins associated with a region are contemplated by this disclosure. The data channel 510 may include any quantity of C/A pins. For example, the data channel 510 may include one, two, three, or four C/A pins. In some cases, the data channel 510 may include an error correction code (ECC) pin (not shown) for facilitating error detection and correction procedures.

The data channel pair 525 may be similarly embodied as the data channel 510 except that two data channels associated with two different cell regions may be configured to share clock pins. As such, in the data channel pair 525, the clock pins (e.g., CLK and RCLK) may be coupled with two cell regions of the same layer of the memory device, while the other pins of the data channel pair 525 (e.g., DQ pins, C/A pins, ECC pins) may be coupled with a single cell region of a single layer. For example, the illustrated data channel pair 525 may have a width of four. As such, four data pins and one C/A pin (e.g., CH0-Layer0) may be coupled with the second cell region 530 and four data pins and one C/A pin (CH8-Layer0) may be coupled with the third cell region 535.

The data channel pair 525 may reduce the complexity of a memory device and the power consumption of the memory device. For example, by sending a single set of clock signals to two cell regions in a layer, it may reduce the quantity of clock components in the memory device and thereby reduce the amount of power to drive the clock signals.

In some cases, the channel widths of the data channels may be configurable based on the type of substrate used to couple the host device and the memory device and/or the type of modulation scheme used to modulate signals communicated between the host device and the memory device. Different types of substrates may be able to support different signal frequencies. For example, organic substrates may be configured to support higher signal frequencies than high-density interposers (e.g., silicon and/or glass) because of the size of the wires used to communicate the signals. In such examples, high-density interposers may be configured to transfer data at the same rate as organic substrates by using a wider channel.

Memory devices may be configured to couple with a variety of different interfaces. For example, the terminuses of the channels 510 or 525 may be in a different location than the terminuses a bumpout or bailout associated with the host device. In such cases, interconnects may be used to bridge the gap and couple the channels 510, 525 with the host device.

Figure 6:
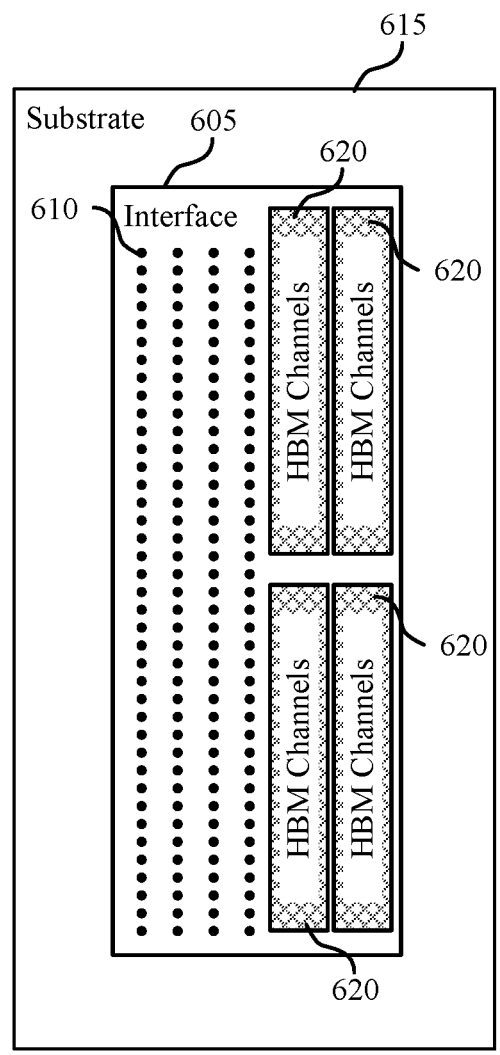
FIG. 6 illustrates an example of a diagram that supports channel routing for a memory device in accordance with examples of the present disclosure.

FIG. 6 illustrates an example of a diagram 600 of an interface 605 that supports channel routing for a memory device in accordance with various examples of the present disclosure. The interface 605 may include a plurality of interface terminals 610. The interface terminals 610 may be configured to couple with specific pins of a memory device.

Some memory technologies have defined a preconfigured set of interface terminals, where each interface terminal has a specific location and a specific function. The locations and functions of each terminal may be preconfigured and not subject to change. This way, device makers can build parts to interact with the static set of terminals and memory makers can make memory devices that interact with the same static set of terminals. This makes the memory technology more interchangeable and functional with a wider variety of designers and device-makers.

The interface 605 may be in contact with or built on a substrate 615. The interface 605 may be positioned in a centralized location of the substrate 615. In some cases, the interface 605 may be positioned off-center relative to the substrate 615. The die area of the interface 605 may be smaller than the die area of a memory device or memory die coupled with the interface 605. In some cases, the interface 605 may be centralized relative to the die area of the corresponding memory device. The substrate 615 may be part of a memory device or may be part of a device, such as a host device.

The interface 605 may comprise a plurality of interface terminals 610. Each interface terminal 610 may have a preconfigured location in the interface 605 and/or a preconfigured function. In some cases, terminals of the same function may be grouped together. For example, the interface terminals 610 for the channel terminals for data pins that couple with the memory device may be grouped into one of the groups 620. The groups 620 may include a plurality of interface terminals 610 configured to couple with data pins of the channels of the memory device. In some cases, at least some, if not each, of group 620 may include multiple HBM channels (e.g., two or more).

In some cases, the interface 605 may be referred to as a bumpout or a bailout. The bumpout may include a plurality of bumps, where each bump may correspond to at least one interface terminals 610. The interface 605 may comprise a bump matrix that includes a plurality of rows and a plurality of columns of interface terminals 610. The location of each interface terminal 610 be defined, in part, by its row and column designation. For example, in some examples of HBM, the interface 605 may comprise 220 rows and 68 columns of interface terminals 610 or bumps in the bump matrix. The interface 605 may be center-aligned with the die of the memory device. In some cases, the interface 605 may be in some another type of alignment with the die of the memory device.

Each type or subset of memory technology may have different layouts of interfaces. For example, HBM may have a first layout for the interface although HBM2 may have a second layout for the interface that may be different than the first layout. In some cases, two different memory technologies may have the same quantity of interface terminals and the same size of terminal matrix, but the functions of each interface terminal may be different, thus resulting in a different layout.

Issues may arise when a memory device and a host device do not use the same preconfigured interface. Techniques are described herein for coupling an interface with a set of preconfigured pins with a non-compliant part that does not include a corresponding interface with the same set of preconfigured pins.

Figure 7:
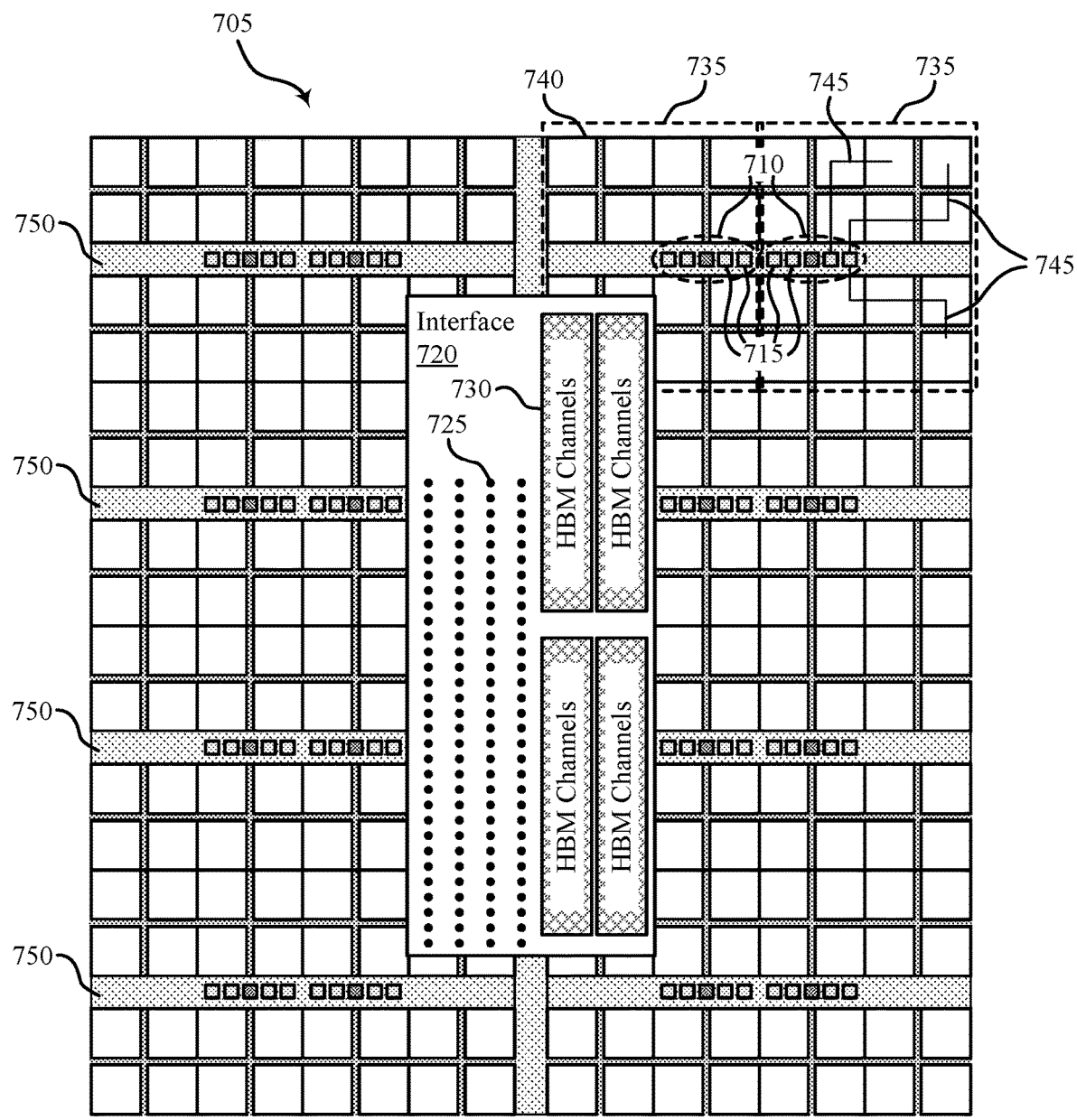
FIG. 7 illustrates an example of a diagram that supports channel routing for a memory device in accordance with examples of the present disclosure.

FIG. 7 illustrates an example of a diagram 700 that supports channel routing for a memory device in accordance with various examples of the present disclosure. The diagram 700 illustrates a memory die 705 that includes a plurality of channels 710 and a plurality of channel terminals 715. The diagram 700 also illustrates a centralized interface 720 or bailout overlaying the memory die 705. The centralized interface 720 includes a plurality of interface terminals 725, where some of the interface terminals 725 may be configured in groups 730. The diagram 700 illustrates how the locations of the interface 720 may not be aligned with the channel terminals 715 of the memory die 705 and how that can impede connections between the memory die 705 and the interface 720. In some cases, at least some, if not each, of group 730 may include multiple HBM channels (e.g., two or more).

The memory die 705 may be an example of the memory die 400 described with reference to FIG. 4. The memory die 705 may be divided into regions 735, each region 735 may include a plurality of banks 740, and each bank 740 may include a plurality of memory cells. A region 735 of the memory die 705 may be coupled to a single channel 710. The channel 710 may be configured to couple the region 735 of the memory die 705 with the interface 720 (e.g., and eventually or indirectly with a host device).

A channel 710 may couple the memory cells of the region 735 with the channel terminals 715. The plurality of channels 710 may include a plurality of pins 745 coupled with the memory cells. Pins 745 may be dedicated to specific functions, as described with more detail with reference to FIG. 5. For example, pins may be data pins, clock pins, command/address pins, or other types of pins, or some combination thereof. The channel terminal 715 may include at least a subset (e.g., portion) dedicated to one or more types of pin 745.

In some cases, the memory die 705 may be one of several memory dies 705 in a stack of memory dies. The channel terminals 715 may correspond to TSV locations in the memory die 705. The pins 745 route signals between the memory cells and the TSVs and the TSVs route the signals between the pins and the channel terminals 715. In some examples, a pin count of the plurality of channels 710 of the memory device may be less than a pin count of an HBM ballout. In some examples, a pin count of the plurality of channels 710 of the memory device may be more than a pin count of an HBM ballout.

Minimizing the length of the pins 745 within the memory die 705 may reduce the power consumed during an access operation (e.g., read or write) of the memory die 705 and/or may decrease the latency for an access operation. Further minimizing the conductive path between the channel terminals 715 and the interface terminals 725 may also reduce energy consumption and latency.

Channel terminals 715 may be distributed relative to the memory die 705 to minimize the path length between memory cell and the host device. In some cases, the channel terminal 715 for each region 735 may be positioned within the region 735. A shared channel terminal 715 may service two regions in the memory die 705. In such cases, the shared channel terminal 715 may include some terminals that may be shared by the two regions, and some channels that may be dedicated to each region (e.g., not shared).

Another design feature that may reduce power consumption and latency as compared to other memory dies may be direct connections between a power plane or ground plane of a substrate and the memory die 705. The memory die 705 may include a plurality of I/O areas 750 (e.g., I/O stripes) for coupling with power or ground. The I/O areas 750 may include a plurality of power terminals and/or ground terminals (e.g., power bumps or ground bumps). In some cases, a TSV through an interposer or other communication medium may provide direct coupling between the memory die 705 and the power plane or the ground plane.

Locations of the channel terminals 715 of the memory die 705 and locations of the interface terminals 725 of the centralized interface 720, in some cases, may not match perfectly. This mismatch may, in other designs, cause the memory die 705 to be unable to communicate with the centralized interface 720 without additional routing of the channels 710. In some cases, the device 700 may include a redistribution layer that may include a plurality of interconnects that couple a channel terminal 715 with an interface terminal 725 to compensate for mismatch.

Figure 8:
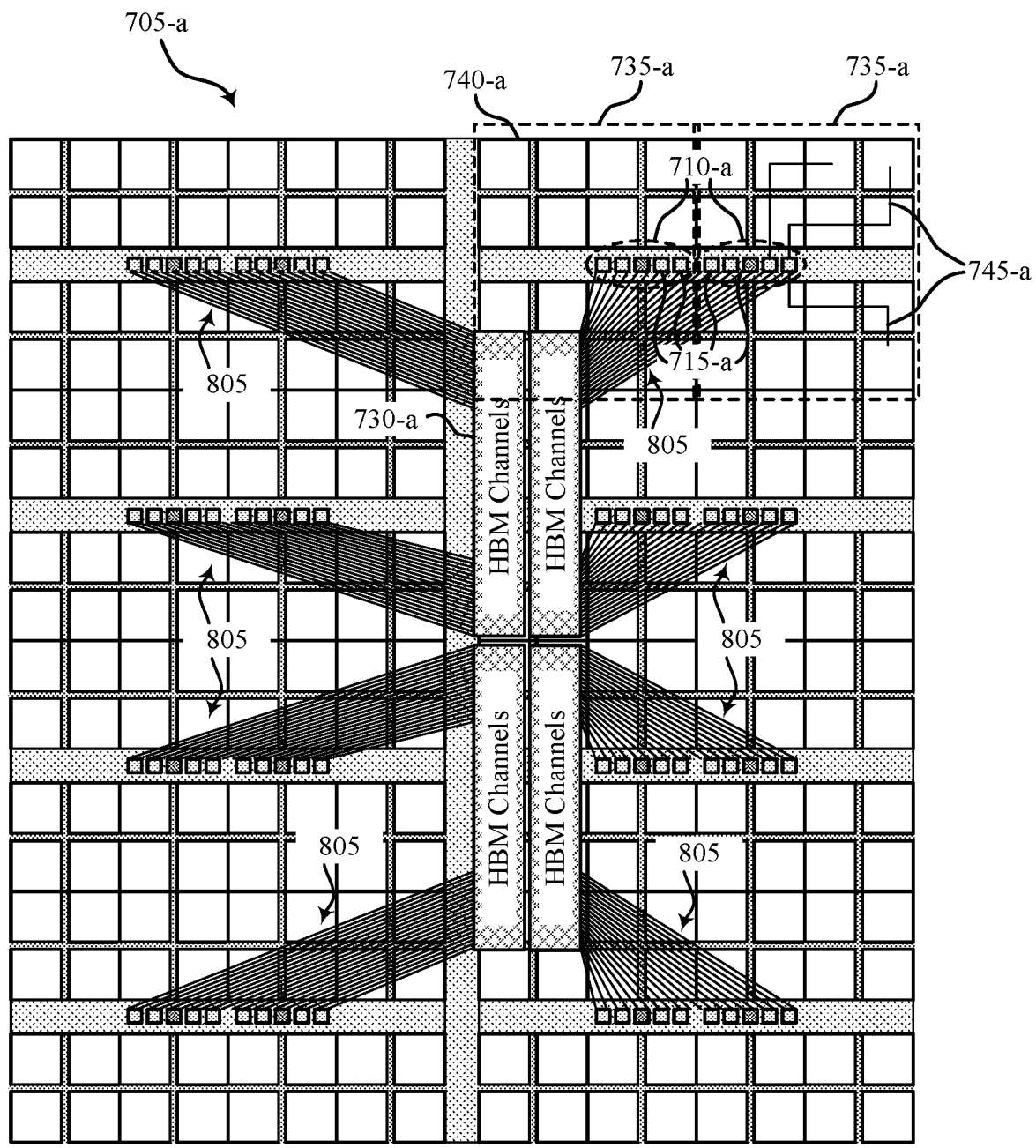
FIG. 8 illustrates an example of a diagram that supports channel routing for a memory device in accordance with examples of the present disclosure.

FIG. 8 illustrates an example of a diagram 800 that supports channel routing for a memory device in accordance with various examples of the present disclosure. The diagram 800 illustrates how a plurality of interconnects 805 may couple the channels 710-a of a memory die 705-a with a centralized interface 720-a.

The interconnects 805 may be configured to route signals between the locations of the interface terminals 725-a (e.g., bump locations on a bumpout) and the locations of the channel terminals 715-a of the channels 710-a (e.g., through-silicon-via (TSV) locations in the memory die 705-a). The interconnects 805 may be configured to couple groups 730-a of interface terminals 725-a to the channel terminals 715-a. The interconnects 805 may be configured to translate between a memory die 705-a and an interface 720-a. For example, if the memory die uses a first memory technology (e.g., finer grain DRAM) and the interface 720-a is for a second memory technology (e.g., HBM, HBM2, HBM3, HBM3x, etc.), the interconnects 805 may be configured to couple the channel terminals 715-*a* that may be distributed throughout the memory die 705-*a* with the interface terminals 725-*a* of the centralized interface 720-*a*.

The interconnects 805 may include a variety of different paths to couple the terminals together. The diagram 800 illustrates the interconnects as direct lines between the channel terminals 715-*a* and interface terminals 725-*a*. In some cases, however, other paths with bends, curves, and other perturbations for the interconnects 805 are contemplated by this disclosure.

The interconnects 805 may comprise a conductive path formed between the interface terminals 725-*a* and the channel terminals 715-*a*. The conductive path may be configured to communicate signals between the two connected terminals. The interconnects 805 may be configured to connect two memory technologies that use different layouts for their terminals. For example, the interconnects 805 may be configured to couple a finer-grain DRAM memory die that has channel terminals distributed throughout the memory die with an HBM bailout, HBM2 bailout or some other preconfigured layout or bailout.

Figure 9:
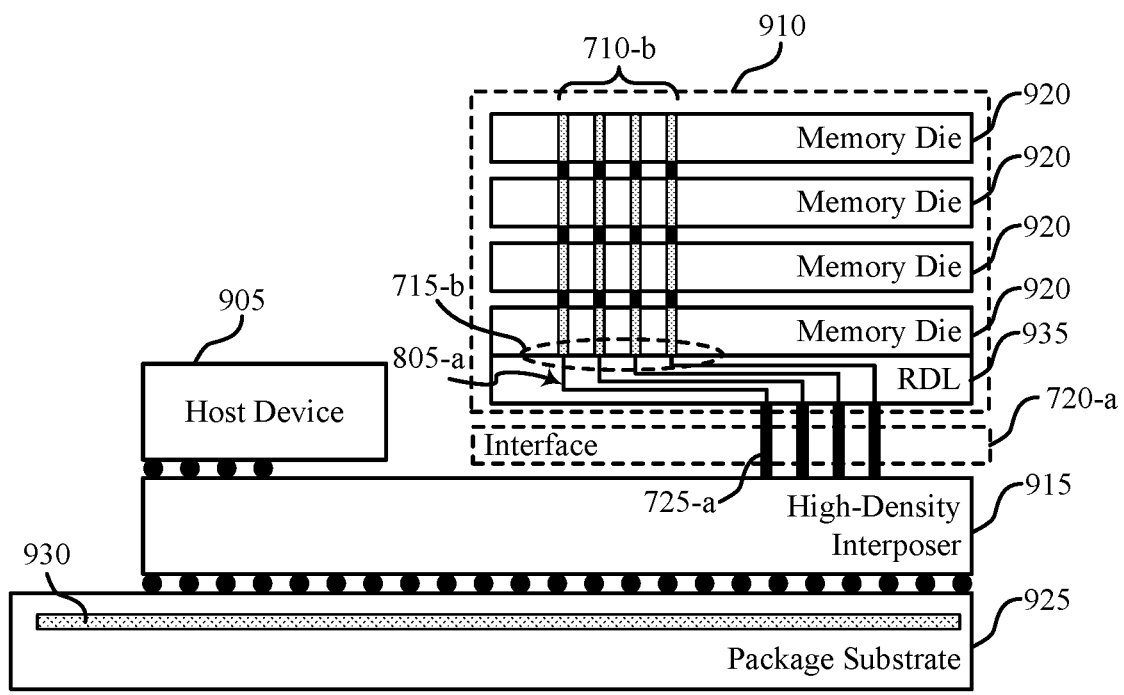
FIG. 9 illustrates an example of a device that supports channel routing for a memory device in accordance with examples of the present disclosure.

FIG. 9 illustrates an example of a device 900 that supports channel routing for a memory device in accordance with various examples of the present disclosure. The device 900 may include a host device 905 coupled with a memory device 910 using a high-density interposer 915 (such as a silicon interposer or a glass interposer). The high-density interposer 915 may be positioned on a package substrate 925. In some cases, the package substrate 925 may include a power or ground plane 930, or both. The device 900 may be an example of the system 200 described with reference to FIG. 2. The host device 905 may be an example of the host device 205 described with reference to FIG. 2. The memory device 910 may be an example of the memory devices 210, 300 and portions of memory devices described with reference to FIGS. 2-5. The package substrate 925 may be an example of the substrate described with reference to FIG. 3. The memory device 910 may include one or more memory dies 920. The memory dies 920 may each be examples of the memory dies 305, 400, and 705 described with reference to FIGS. 3, 4, and 7-8. In some cases, the memory dies 920 may be referred to as memory arrays, arrays of memory cells, or decks of memory cells.

The high-density interposer 915 may include a plurality of channels that couple the memory device 910 with the host device 905. Such channels may have a resistance and that resistance may impact an amount of power it takes to transmit data at a given data rate or frequency. As the frequency of the signal communicated using the package substrate 925 increases, the amount of power needed to transmit the signal may increase (e.g., in a non-linear relationship). A data rate of the memory device 910 may be based on the type of substrate used to communicate signals. In some cases, the data rate of the memory device 910 may also be based on the performance constraints of the host device 905. For example, as the performance constraints of the host device 905 increase, the acceptable threshold for power consumption may also increase.

Other characteristics of the memory device 910 may also be determined based on the performance constraints and/or the type of communication medium. For example, the channel width of the data channel may be determined. In many memory devices, the amount of data channels may be fixed by legacy technology (e.g., the quantity of data channels between the host device 905 and the memory device 910 may be sixteen data channels). As the channel width goes up, the quantity of pins used to communicate payload data, control data, and/or clock signals may be increased. In other examples, the quantity of banks in a cell region, or said another way, the quantity of banks accessed using a single data channel, may be determined based on the performance constraints and/or the type of communication medium. In other examples, the quantity of clock signals used in the memory device may be determined based on the performance constraints and/or the type of communication medium.

In addition, various characteristics of the clock signals may be determined based on the performance constraints and/or the type of communication medium. For example, the frequency and phase of the clock signals may be determined based on the performance constraints and/or the type of communication medium. In other examples, the use of an ECC pin may be determined based on the performance constraints and/or the type of communication medium. In other examples, pin drivers may be activated or deactivated based on the performance constraints and/or the type of communication medium. In other examples, whether the memory device includes data channel pairs may be based on the performance constraints and/or the type of communication medium. In other examples, a modulation scheme (e.g., NRZ or PAM4) for signals communicated over the pins may be determined based on the performance constraints and/or the type of communication medium.

In some examples, the memory device 910 with the package substrate 925 may be configured to meet a fixed performance constraint (e.g., 4 TB/s) of the host device 905. In such examples, the memory device 910 may have a data rate of 19 GB/s, the channel width of the data channel may be four data pins (e.g., X4) with a single C/A pin (e.g., data channel 510 as described with reference to FIG. 5), the quantity of banks of memory cells in a cell region may be sixteen, and the memory device 910 may include a 4-phase clock signal. The 4-phase clock signal may include a first signal at 4 GHz and a phase of zero, a second signal at 4 GHz and a phase of 90 degrees, a third signal at 4 GHz and a phase of 180 degrees, and a fourth signal at 4 GHz and a phase of 270 degrees. In other examples, the frequencies and the phases of the clock signals may be different.

The memory device 910 may include a redistribution layer 935 (RDL) that may include a plurality of interconnects 805-*a*. The redistribution layer 935 may be an example of fan-out packaging and may be formed using fan-out packaging manufacturing techniques. In some cases, an interface 720-*a* may be positioned between the memory device 910 and the high-density interposer 915. The interface 720-*a* may include a plurality of interface terminals 725-*a*. The redistribution layer 935 may be configured to couple the interface terminals 725-*a* of the interface 720-*a* with the channel terminals 715-*b* of the memory device 910.

The memory device 910 may include a plurality of memory dies 920 stacked on top of one another. Each memory die 920 may be an example of the memory die 705 described with reference to FIGS. 7 and 8. In some cases, the channels 710-*b* may include a plurality of TSVs extending between the memory dies 920. Each memory die 920 may include a plurality of pins that couple the memory cells to the channels 710-*b*. The channel terminals 715-*b* may be where the channels 710-*b* end at the bottom of the lowermost memory die 920. Memory cells of the memory device 910 may be coupled with the host device 905 by a point-to-point connection using the channels of the high-density interposer 915, the interconnects 805-*a*, the channels 710-*b*, and/or the pins within the memory dies 920.

Figure 10:
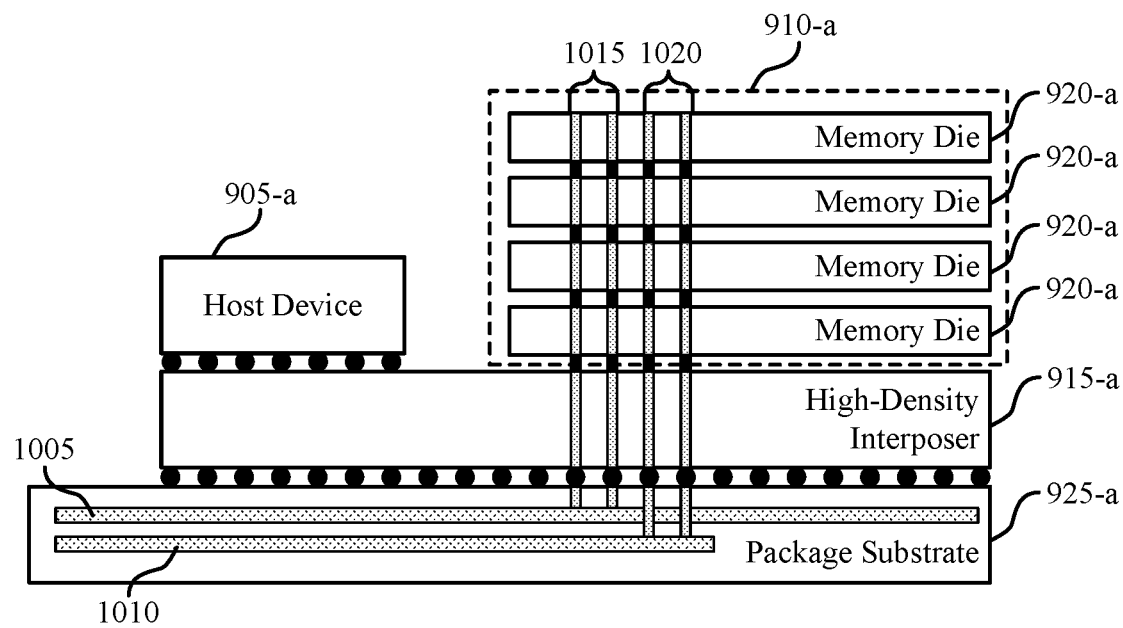
FIG. 10 illustrates an example of a device that supports channel routing for a memory device in accordance with examples of the present disclosure.

FIG. 10 illustrates an example of a device 1000 that supports channel routing for a memory device in accordance with various examples of the present disclosure. The device 1000 illustrates routing for power and ground connections between a power plane 1005 and a ground plane 1010 of the package substrate 925-a and the memory dies 920-a of the memory device 910-a. The device 1000 may be an example of the device 900 described with reference to FIG. 9. As such, full descriptions of the various components of the device 1000 are not repeated here.

The device 1000 may include a plurality of power channels 1015 and/or a plurality of ground channels 1020. The plurality of power channels 1015 may be configured to couple one or more memory dies 920-a of the memory device 910-a with the power plane 1005 of the package substrate. The plurality of ground channels 1020 may be configured to couple one or more of the memory dies 920-a of the memory device 910-a with the ground plane 1010 of the package substrate. In some cases, the power channels 1015 and the ground channels 1020 may comprise TSVs and one or more pins. Pins may be used do distribute power and ground potential through the memory dies 920-a.

In some cases, an interface may be positioned between the memory device 910-a and the high-density interposer 915-a. The interface may include a plurality of interface terminals dedicated to power and/or ground potential. These plurality of interface terminals may be grouped and positioned in a similar location. To reduce the amount of power used per bit in the memory device 910-a, the path between the power plane 1005 and/or the ground plane 1010 and the respective memory dies 920-a may be shortened compared to other memory technologies. Instead of routing the power channels 1015 and/or the ground channels 1020 to the interface and/or the dedicated interface terminals, the ground channels 1020 and the ground channels 1020 may include one or more TSVs extending through the high-density interposer and creating a direct connection with the power plane 1005 and/or the ground plane 1010. In some cases, TSVs may also, at least partially, go through the package substrate and/or redistribution layer (if present) and/or the interface (if present).

The memory device 910-a may also include I/O areas (e.g., I/O areas 750). The I/O areas of the memory die 705 may include the power channels 1015 and/or the ground channels 1020. Each region 735 of the memory device 910-a may be configured to straddle at least one I/O area so that the distance between each memory cell and the power channels 1015 and the ground channels 1020 may be minimized.

Although not expressly shown, the memory device 910-b of the device 1000 may include a redistribution layer in some examples. In such cases, the power channels or the ground channels may include TSVs that extend through the redistribution layer as well as the other memory dies.

Figure 11:
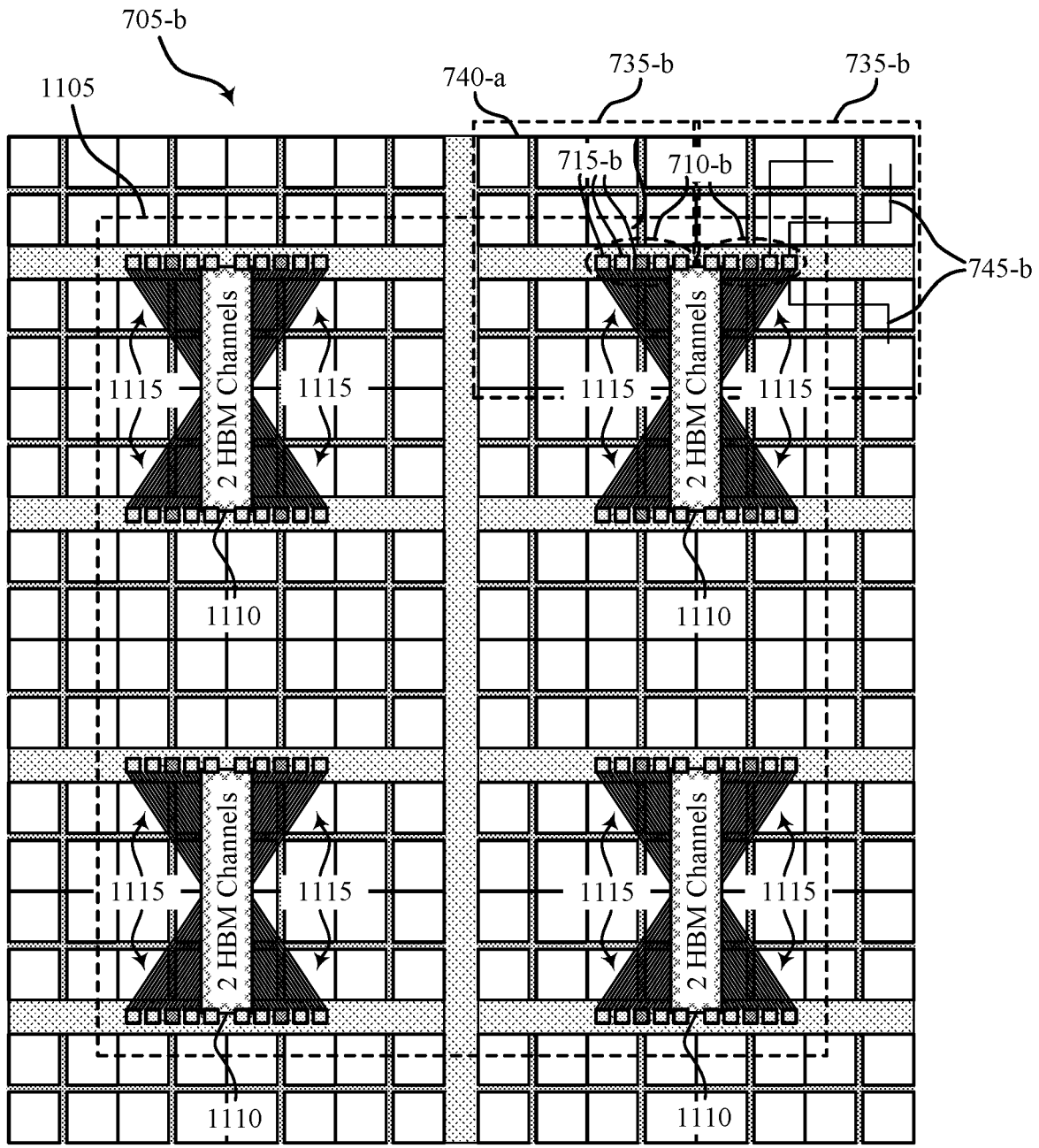
FIG. 11 illustrates an example of a diagram that supports channel routing for a memory device in accordance with examples of the present disclosure.

FIG. 11 illustrates an example of a diagram 1100 that supports channel routing for a memory device in accordance with various examples of the present disclosure. The diagram 1100 illustrates how a memory die 705-b may be coupled with an interface 1105 whose interface terminals dedicated to data channels may be distributed across the die area of the memory die 705-b instead of being centralized.

The interface 1105 may include a plurality of interface terminals configured to couple with the memory die 705-b. Instead of being centralized, portions of the interface terminals may be distributed throughout the die area. For example, groups 1110 of interface terminals may be dispersed in four different quadrants of the die area. Given the distributed nature of the channel terminals 715-b throughout the memory die 705-b, the distance between locations of the interface terminals and locations of the channel terminals may be less than when a centralized interface is used, such interface 720 described with reference to FIG. 7. In some cases, the interface 1105 may include spaced out a distributed between the groups 1110. The interface 1105 may include clumps of interface terminals separated by spaces devoid of interface terminals. In some cases, at least some if not each group 1110 may include multiple HBM channels (e.g., two or more).

The interface terminals of the interface 1105 may be coupled with the channel terminals 715-b using a plurality of interconnects 1115. The interconnects 1115 may be examples of the interconnects 805 described with reference to FIGS. 8 and 9. The interconnects 1115 may be part of a redistribution layer and/or a fan out package. An average length of the interconnects 1115 may be less than an average length of the interconnects 805 because the groups 1110 of interface terminals are positioned closer to the channel terminals 715-b of the memory die 705-b.

The interconnects 1115 may be configured to route signals between the locations of the interface terminals 725-b (e.g., bump locations on a bumpout) and the locations of the channel terminals 715-b of the channels 710-b (e.g., TSV locations in the memory die 705-b). The interconnects 1115 may be configured to translate between a memory die 705-b and an interface 720-b. For example, if the memory die uses a first memory technology (e.g., finer grain DRAM) and the interface 1105 is for a second memory technology (e.g., HBM, HBM2, HBM3, HBM3x, etc.), the interconnects 1115 may be configured to couple the channel terminals 715-b that are distributed throughout the memory die 705-b with the interface terminals 725-b distributed throughout the interface 1105.

In one example, a device or system may include a memory device comprising an array of memory cells and a plurality of channels coupled with a plurality of channel terminals distributed in the array of memory cells, the array of memory cells comprising a plurality of regions that each include a plurality of banks of memory cells, each channel of the plurality of channels being coupled with at least one region of the plurality of regions, a substrate comprising a centralized interface configured to couple with the plurality of channel terminals of the memory device and establish a communication link between the substrate and the memory device, and a plurality of interconnects configured to couple with the plurality of channel terminals distributed throughout the array of memory cells of the memory device and the centralized interface of the substrate.

In some examples, the centralized interface of the substrate comprises a high-bandwidth memory (HBM) bailout. In some examples of the device or system, a pin count of the plurality of channels of the array of memory cells may be less than a pin count of the HBM bailout. In some examples of the device or system, a pin count of the plurality of channels of the array of memory cells may be more than a pin count of the HBM bailout. In some examples of the device or system, the memory device further comprises: a plurality of power pins terminating at a plurality of power terminals positioned in one or more input/output areas that extend through the array of memory cells.

In some examples of the device or system, the plurality of power pins includes a plurality of ground pins and the plurality of power terminals includes a plurality of ground terminals. In some examples of the device or system, the centralized interface of the substrate may be configured to couple with the plurality of power pins positioned in the one or more input/output areas using at least some of the plurality of interconnects.

In some examples of the device or system, the plurality of power pins comprise one or more through-silicon-vias (TSVs) extending through one or more layers of the memory device to directly couple the array of memory cells with a power source.

In some examples of the device or system, the power source may be a power plane of the substrate. In some examples of the device or system, each channel terminal of the plurality of channel terminals may be associated with a region of the plurality of regions.

In some examples of the device or system, each channel of the plurality of channels comprises a plurality of pins extending between the channel terminal of the region and memory cells of the region. In some examples of the device or system, each channel terminal of the plurality of channel terminals may be positioned within the region associated with the channel terminal. In some examples of the device or system, each channel terminal of the plurality of channel terminals may be positioned between at least two banks of the region associated with the channel terminal.

In some examples of the device or system, the memory device may be a bufferless memory device. In some examples of the device or system, the memory device further comprises one or more channel pairs, each channel pair comprising a first set of pins dedicated to a first region, a second set of pins dedicated to a second region different than the first region, and a third set of pins shared by the first region and the second region.

In some examples of the device or system, a channel pair may be associated with two regions adjacent to one another. In some examples of the device or system, the memory device further comprises a test substrate configured to allow the array of memory cells to be tested before being coupled with the centralized interface of the substrate. In some examples of the device or system, a redistribution layer coupled with the memory device and the substrate, the redistribution layer comprising the plurality of interconnects.

In some examples of the device or system, the plurality of interconnects may be formed using fan out packaging (FOP) techniques. In some examples of the device or system, the substrate may be part of a host device configured to store information on the memory device coupled with the centralized interface. In some examples of the device or system, the host device may be configured to communicate with a high-bandwidth memory (HBM) device.

In one example, a device or system may include a memory device comprising an array of memory cells and a plurality of channels coupled with a plurality of channel terminals distributed in the array of memory cells, the array of memory cells comprising a plurality of regions that each include a plurality of banks of memory cells, each channel of the plurality of channels being coupled with at least one region of the plurality of regions, a substrate comprising a plurality of interfaces distributed in the substrate, the plurality of interfaces configured to couple with the plurality of channel terminals of the memory device and establish a communication link between the substrate and the memory device, and a plurality of interconnects coupled with the plurality of channel terminals distributed in the array of memory cells of the memory device and the plurality of interfaces distributed in the substrate.

In some examples of the device or system, each interface of the plurality of interfaces comprises a portion of a high-bandwidth memory (HBM) ballout. In some examples of the device or system, a pin count of the plurality of channels of the array of memory cells may be less than a pin count of the HBM ballout. In some examples of the device or system, a pin count of the plurality of channels of the array of memory cells may be more than a pin count of the HBM ballout.

In some examples of the device or system, each interface may be configured to couple with a subset of channel terminals. In some examples of the device or system, each interface may be positioned in the substrate to be in proximity to the subset of channel terminals associated with the interface.

In some examples of the device or system, the memory device further comprises: a plurality of power pins terminating at a plurality of power terminals positioned in one or more input/output areas that extend through the array of memory cells. In some examples of the device or system, the plurality of power pins includes a plurality of ground pins and the plurality of power terminals includes a plurality of ground terminals.

In some examples of the device or system, each interface of the substrate may be configured to couple with the plurality of power pins positioned in the one or more input/output areas using at least some of the plurality of interconnects. In some examples of the device or system, the plurality of power pins comprise one or more through-silicon-vias (TSVs) extending through one or more layers of the memory device to directly couple the array of memory cells with a power source.

In some examples of the device or system, the power source may be a power plane of the substrate. In some examples of the device or system, each channel terminal of the plurality of channel terminals may be associated with a region of the plurality of regions. In some examples of the device or system, each channel of the plurality of channels comprises a plurality of pins extending between the channel terminal of the region and memory cells of the region.

In some examples of the device or system, each channel terminal of the plurality of channel terminals may be positioned within the region associated with the channel terminal. In some examples of the device or system, each channel terminal of the plurality of channel terminals may be positioned between at least two banks of the region associated with the channel terminal.

In some examples of the device or system, the memory device may be a bufferless memory device. In some examples of the device or system, the memory device further comprises one or more channel pairs, each channel pair comprising a first set of pins dedicated to a first region, a second set of pins dedicated to a second region different than the first region, and a third set of pins shared by the first region and the second region.

In some examples of the device or system, a channel pair may be associated with two regions adjacent to one another. In some examples of the device or system, the memory device further comprises a test substrate configured to allow the array of memory cells to be tested before being coupled with the substrate.

In some examples of the device or system, a redistribution layer coupled with the memory device and the substrate, the redistribution layer comprising the plurality of interconnects. In some examples of the device or system, the plurality of interconnects may be formed using fan out packaging (FOP) techniques.

In some examples of the device or system, the substrate may be part of a host device configured to store information on the memory device coupled with the plurality of interfaces. In some examples of the device or system, the host device may be configured to communicate with a high-bandwidth memory (HBM) device.

In one example, a device or system may include an array of memory cells and a plurality of channels terminating at a plurality of channel terminals, the array of memory cells comprising a plurality of regions that each include a plurality of banks of memory cells, each channel of the plurality of channels being coupled with a region of the plurality of regions and a channel terminal of the plurality of channel terminals, each channel terminal of the plurality of channel terminals being positioned within a footprint of the region associated with the channel terminal, a redistribution layer comprising a plurality of interconnects coupled with the plurality of channel terminals, and a substrate comprising a centralized interface coupled with the plurality of channel terminals the plurality of interconnects.

In some examples of the device or system, the centralized interface of the substrate comprises a high-bandwidth memory (HBM) ballout. In some examples of the device or system, a pin count of the plurality of channels of the array of memory cells may be less than a pin count of the HBM ballout. In some examples of the device or system, a pin count of the plurality of channels of the array of memory cells may be more than a pin count of the HBM ballout.

In some examples of the device or system, a plurality of power pins terminating at a plurality of power terminals positioned in one or more input/output areas that extend through the array of memory cells. In some examples of the device or system, the plurality of power pins includes a plurality of ground pins and the plurality of power terminals includes a plurality of ground terminals. In some examples of the device or system, the centralized interface of the substrate may be configured to couple with the plurality of power pins positioned in the one or more input/output areas using at least some of the plurality of interconnects.

In some examples of the device or system, the plurality of power pins comprise one or more through-silicon-vias (TSVs) extending through one or more layers of the memory device to directly couple the array of memory cells with a power plane of the substrate. In some examples of the device or system, each channel of the plurality of channels comprises a plurality of pins extending between the channel terminal of the region and memory cells of the region.

In some examples of the device or system, the memory device may be a bufferless memory device. Some examples of the device or system described above may also include one or more channel pairs, each channel pair comprising a first set of pins dedicated to a first region, a second set of pins dedicated to a second region different than the first region, and a third set of pins shared by the first region and the second region.

In some examples of the device or system, a test substrate configured to allow the array of memory cells to be tested before being coupled with the centralized interface of the substrate. In some examples of the device or system, the plurality of interconnects may be formed using fan out packaging (FOP) techniques.

In one example, a device or system may include an array of memory cells and a plurality of channels terminating at a plurality of channel terminals, the array of memory cells comprising a plurality of regions that each include a plurality of banks of memory cells, each channel of the plurality of channels being coupled with a region of the plurality of regions and a channel terminal of the plurality of channel terminals, each channel terminal of the plurality of channel terminals being positioned within a footprint of the region associated with the channel terminal, a redistribution layer comprising a plurality of interconnects coupled with the plurality of channel terminals, and a substrate comprising a plurality of interfaces distributed in the substrate, the plurality of interfaces coupled with the plurality of channel terminals.

In some examples of the device or system, each interface of the plurality of interfaces comprises a portion of a high-bandwidth memory (HBM) ballout. In some examples of the device or system, a pin count of the plurality of channels of the array of memory cells may be less than a pin count of the HBM ballout. In some examples of the device or system, a pin count of the plurality of channels of the array of memory cells may be more than a pin count of the HBM ballout.

In some examples of the device or system, each interface may be configured to couple with a subset of channel terminals. In some examples of the device or system, each interface may be positioned in the substrate to be in proximity to the subset of channel terminals associated with the interface.

In some examples of the device or system, a plurality of power pins terminating at a plurality of power terminals positioned in one or more input/output areas that extend through the array of memory cells. In some examples of the device or system, the plurality of power pins includes a plurality of ground pins and the plurality of power terminals includes a plurality of ground terminals.

In some examples of the device or system, each interface of the substrate may be configured to couple with the plurality of power pins positioned in the one or more input/output areas using at least some of the plurality of interconnects. In some examples of the device or system, the plurality of power pins comprise one or more through-silicon-vias (TSVs) extending through one or more layers of the memory device to directly couple the array of memory cells with a power plane of the substrate.

In some examples of the device or system, each channel of the plurality of channels comprises a plurality of pins extending between the channel terminal of the region and memory cells of the region. In some examples of the device or system, the memory device may be a bufferless memory device having a direct connection between the array of memory cells and the plurality of channels.

Some examples of the device or system described above may also include one or more channel pairs, each channel pair comprising a first set of pins dedicated to a first region, a second set of pins dedicated to a second region different than the first region, and a third set of pins shared by the first region and the second region.

In some examples of the device or system, a test substrate configured to allow the array of memory cells to be tested before being coupled with the substrate. In some examples of the device or system, the plurality of interconnects may be formed using fan out packaging (FOP) techniques.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (e.g., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks, components, and modules described in connection with the disclosure herein may be implemented or performed with a general-purpose processor, a DSP, an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A system, comprising:
a memory device comprising an array of memory cells and a plurality of channels coupled with a plurality of channel terminals distributed in the array of memory cells, wherein the plurality of channel terminals are distributed in the array of memory cells according to a first layout;
a substrate comprising an interface configured to couple with the plurality of channel terminals of the memory device and establish a communication link between the substrate and the memory device, the interface distributed in the substrate according to a second layout that is different than the first layout; and
a plurality of interconnects configured to couple with the plurality of channel terminals distributed in the first layout and the interface of the substrate distributed in the second layout.

2. The system of claim 1, wherein the interface of the substrate comprises a centralized interface and the plurality of interconnects are configured to couple the interface in a first region of the system.

3. The system of claim 1, wherein the interface comprises a distributed interface, each portion of the distributed interface associated with a respective region of a plurality of regions of the system, and wherein each channel terminal of the plurality of channel terminals is coupled with a respective portion of the distributed interface.

4. The system of claim 1, wherein the interface of the substrate comprises a high-bandwidth memory (HBM) ballout.

5. The system of claim 4, wherein a pin count of the plurality of channels of the array of memory cells is less than a pin count of the HBM ballout.

6. The system of claim 4, wherein a pin count of the plurality of channels of the array of memory cells is more than a pin count of the HBM ballout.

7. The system of claim 1, wherein the memory device further comprises:
a plurality of power pins terminating at a plurality of power terminals positioned in one or more input/output areas that extend through the array of memory cells.

8. The system of claim 7, wherein the plurality of power pins includes a plurality of ground pins and the plurality of power terminals includes a plurality of ground terminals.

9. The system of claim 7, wherein the interface of the substrate is configured to couple with the plurality of power pins positioned in the one or more input/output areas using the at least some of the plurality of interconnects.

10. The system of claim 7, wherein the plurality of power pins comprise one or more through-silicon-vias (TSVs) extending through one or more layers of the memory device to directly couple the array of memory cells with a power source.

11. The system of claim 10, wherein the power source is a power plane of the substrate.

12. The system of claim 1, wherein each channel terminal of the plurality of channel terminals is associated with a region of a plurality of regions.

13. The system of claim 12, wherein each channel of the plurality of channels comprises a plurality of pins extending between the channel terminal of the region and memory cells of the region.

14. The system of claim 12, wherein each channel terminal of the plurality of channel terminals is positioned within the region associated with the channel terminal.

15. The system of claim 1, wherein the memory device is a bufferless memory device.

16. The system of claim 1, wherein the memory device further comprises a test substrate configured to allow the array of memory cells to be tested before being coupled with the interface of the substrate.

17. A memory device, comprising:
an array of memory cells and a plurality of channels terminating at a plurality of channel terminals, wherein the plurality of channel terminals are distributed in the array of memory cells according to a first layout;
a redistribution layer comprising a plurality of interconnects coupled with the plurality of channel terminals; and
a substrate comprising an interface coupled with the plurality of channel terminals and the plurality of interconnects, wherein the interface is distributed in the substrate according to a second layout that is different than the first layout.

18. The memory device of claim 17, wherein the interface of the substrate comprises a centralized interface and the plurality of interconnects are configured to couple the interface in a first region of the memory device.

19. The memory device of claim 17, wherein the interface comprises a distributed interface, each portion of the distributed interface associated with a respective region of a plurality of regions of the memory device, and wherein each channel terminal of the plurality of channel terminals is coupled with a respective portion of the distributed interface.

20. An apparatus, comprising:
a memory device comprising an array of memory cells and a plurality of channels terminating at a plurality of channel terminals, wherein the plurality of channel terminals are distributed in the array of memory cells according to a first layout; and
an interface configured to couple with the plurality of channel terminals of the memory device via a plurality of interconnects and with a host system by a point-to-point connection of a high-density interposer, wherein the interface is distributed in the high-density interposer according to a second layout that is different than the first layout.

* * * * *